(12) United States Patent
Audette et al.

(10) Patent No.: US 11,561,243 B2
(45) Date of Patent: Jan. 24, 2023

(54) COMPLIANT ORGANIC SUBSTRATE ASSEMBLY FOR RIGID PROBES

(71) Applicant: International Business Machines Corporation, Armonk, NY (US)

(72) Inventors: David Audette, Colchester, VT (US); Grant Wagner, Jericho, VT (US); Marc Knox, Hinesburg, VT (US); Dennis Conti, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 478 days.

(21) Appl. No.: 16/568,596

(22) Filed: Sep. 12, 2019

(65) Prior Publication Data

US 2021/0080486 A1 Mar. 18, 2021

(51) Int. Cl.
*G01R 1/073* (2006.01)
*H01R 13/24* (2006.01)
(Continued)

(52) U.S. Cl.
CPC .......... *G01R 1/0735* (2013.01); *H01R 13/03* (2013.01); *H01R 13/2421* (2013.01);
(Continued)

(58) Field of Classification Search
CPC .......... G01R 1/07307; G01R 1/06733; G01R 1/07314; G01R 1/0735; G01R 1/06738; G01R 1/06711; G01R 1/06716; G01R 1/07357; G01R 1/06772; G01R 1/07342; G01R 1/0466; G01R 1/07378; G01R 1/06744; G01R 1/06722; G01R 31/2887; G01R 1/0416; G01R 1/0441; G01R 1/073; G01R 31/31713; G01R 31/31905; H01R 12/714; H01R 13/24; H01R 2201/20;
(Continued)

(56) References Cited

U.S. PATENT DOCUMENTS 4,199,209 A * 4/1980 Cherian ............... H01R 12/714
439/515
4,642,889 A 2/1987 Grabbe
(Continued)

FOREIGN PATENT DOCUMENTS

CN 110120357 A 8/2019
DE 3737987 A * 5/1989 ............. B60K 13/04
(Continued)

OTHER PUBLICATIONS

David Audette et al., "Interconnect and Tuning Thereof", U.S. Appl. No. 16/568,598, filed Sep. 12, 2019.
(Continued)

*Primary Examiner* — Vinh P Nguyen
(74) *Attorney, Agent, or Firm* — Cantor Colburn LLP; Samuel Waldbaum

(57) ABSTRACT

A wafer test device and methods of assembling a wafer test device involve a first laminate structure, and a second laminate structure arranged to interface with a microcircuit of the wafer. The wafer test device includes a compliant layer between the first laminate structure and the second laminate structure. The compliant layer includes an elastomer that exhibits compliance within a limited range of movement.

16 Claims, 5 Drawing Sheets

(51) Int. Cl.
*H01R 43/00* (2006.01)
*H01R 43/20* (2006.01)
*H01R 13/03* (2006.01)

(52) U.S. Cl.
CPC ....... *H01R 13/2464* (2013.01); *H01R 43/007* (2013.01); *H01R 43/20* (2013.01)

(58) Field of Classification Search
CPC ............ H01R 13/2421; H01R 13/2407; H01R 13/2464; H01R 12/52; H01R 43/007; H01R 4/04; H01R 43/20; H01L 2924/14; H01L 2224/48227; H01L 2224/4903; H01L 2224/4824; H01L 24/81; H01L 2225/0651; H01L 23/32; H01L 24/12; H01L 24/13; H01L 24/16; H01L 24/45; H01L 24/48; H01L 24/49; H01L 2924/15312
See application file for complete search history.

(56) References Cited

U.S. PATENT DOCUMENTS

| | | | |
|---|---|---|---|
| 5,207,585 A | | 5/1993 | Byrnes et al. |
| 5,635,846 A * | | 6/1997 | Beaman ............ H01L 23/49827 |
| | | | 324/756.03 |
| 5,800,184 A | | 9/1998 | Lopergolo et al. |
| 5,801,474 A | | 9/1998 | Sakairi |
| 5,806,181 A * | | 9/1998 | Khandros .............. H01R 43/16 |
| | | | 29/874 |
| 5,838,160 A | | 11/1998 | Beaman et al. |
| 5,945,897 A | | 8/1999 | Pluymers et al. |
| 6,068,669 A | | 5/2000 | Farnworth et al. |
| 6,078,500 A * | | 6/2000 | Beaman .................. H01L 23/32 |
| | | | 29/850 |
| 6,275,052 B1 | | 8/2001 | Hembree et al. |
| 6,403,226 B1 * | | 6/2002 | Biernath .............. H01R 12/714 |
| | | | 428/209 |
| 6,405,414 B1 | | 6/2002 | Byrnes et al. |
| 6,524,115 B1 | | 2/2003 | Gates et al. |
| 6,528,349 B1 | | 3/2003 | Patel et al. |
| 6,615,485 B2 | | 9/2003 | Eldridge et al. |
| 6,624,645 B2 | | 9/2003 | Haseyama et al. |
| 6,624,648 B2 | | 9/2003 | Eldridge et al. |
| 6,830,460 B1 | | 12/2004 | Rathburn |
| 7,121,839 B2 | | 10/2006 | Rathburn |
| 7,135,777 B2 | | 11/2006 | Bakir et al. |
| 7,279,788 B2 | | 10/2007 | Canella |
| 7,349,223 B2 | | 3/2008 | Haemer et al. |
| 7,446,548 B2 | | 11/2008 | Chen |
| 7,726,984 B2 | | 6/2010 | Bumb, Jr. et al. |
| 7,750,487 B2 | | 7/2010 | Muthukumar et al. |
| 7,955,088 B2 * | | 6/2011 | Di Stefano ............ H01R 13/24 |
| | | | 439/82 |
| 8,102,184 B2 | | 1/2012 | Sherry et al. |
| 8,269,516 B1 | | 9/2012 | Mardi et al. |
| 8,405,414 B2 | | 3/2013 | Durbin et al. |
| 8,758,067 B2 * | | 6/2014 | Rathburn .............. H01R 12/716 |
| | | | 439/700 |
| 9,007,082 B2 * | | 4/2015 | Nelson .................. G01R 1/0466 |
| | | | 324/750.16 |
| 9,261,537 B2 * | | 2/2016 | Edwards ............ G01R 1/07307 |
| 9,613,911 B2 | | 4/2017 | Rogers et al. |
| 9,659,908 B1 | | 5/2017 | Sahasrabudhe et al. |
| 9,793,635 B2 | | 10/2017 | Lee |
| 10,438,907 B2 | | 10/2019 | Hu et al. |
| 11,322,473 B2 * | | 5/2022 | Audette .................. H01L 24/83 |
| 2002/0075025 A1 | | 6/2002 | Tanaka |
| 2002/0110757 A1 | | 8/2002 | Fork et al. |
| 2004/0200187 A1 | | 10/2004 | Warrier et al. |
| 2005/0040540 A1 | | 2/2005 | Haba et al. |
| 2007/0124707 A1 | | 5/2007 | Sutjahjo et al. |
| 2011/0060562 A1 | | 3/2011 | Yilbas et al. |
| 2011/0114377 A1 | | 5/2011 | Brun |
| 2012/0051005 A1 | | 3/2012 | Vanfleteren et al. |
| 2012/0052268 A1 | | 3/2012 | Axisa et al. |
| 2014/0220422 A1 | | 8/2014 | Rogers et al. |
| 2014/0262498 A1 | | 9/2014 | Hester et al. |
| 2017/0092556 A1 | | 3/2017 | Gustafson |
| 2019/0102505 A1 | | 4/2019 | Audet et al. |
| 2020/0106181 A1 | | 4/2020 | Avser et al. |

FOREIGN PATENT DOCUMENTS

| | | | |
|---|---|---|---|
| JP | 2010127852 A * | 6/2010 | |
| WO | 2004005944 A1 | 1/2004 | |
| WO | 2006101861 A2 | 9/2006 | |

OTHER PUBLICATIONS

List of IBM Patents or Patent Applications Treated as Related; (Appendix P), Filed Sep. 12, 2019; 2 pages.
Zhou et al., "Coplanarity analysis and control of spring probe heads for wafer testing", Chip Scale Review, Feb. 2015, pp. 1-4.

* cited by examiner

COMPLIANT ORGANIC SUBSTRATE ASSEMBLY FOR RIGID PROBES

BACKGROUND

The present invention relates to wafer testing, and more specifically, to a compliant organic substrate assembly for rigid probes.

A wafer is a semiconductor layer used for the fabrication of integrated circuits. The wafer serves as a substrate for microcircuits of microelectronic devices that are built in and on the wafer and that make up the integrated circuits. During fabrication, wafer testing is performed to identify any functional defects in the microelectronic devices. A probe device that can be referred to as a wafer probe is used to perform automated testing. For electrical testing, a set of contacts or probes of the probe device are held in electrical contact with contact points or solder bumps of the microelectronic devices of each microcircuit in turn. Once testing is completed, individual integrated circuits are obtained through a process referred to as dicing. The dicing separates each microcircuit as a die which is then packaged as an integrated circuit.

Existing probe devices include those with vertical probes such as buckling beam needles, for example. The probe device, which can be referred to as a probe card, includes a large number of these needles with pointed or flat tips. As a load is applied to bring the probe card in contact with a microcircuit of the wafer, each of the needles flexes by an amount that is independent of the movement of the other needles. Each needle of the probe card contacts and deforms a corresponding solder bump of the microcircuit. The probe card provides an electrical path between the test system and a given microcircuit of the wafer. The wafer can be moved relative to the probe device to test each microcircuit in turn.

Another existing type of probe device is rigid. An array of rigid probes are mounted on a rigid substrate. The probes are generally copper and may be plated (e.g., nickel or gold plating). Unlike the compliant (i.e., individually flexing) vertical probes, the rigid probes are not limited in the power they can convey to the microelectronic devices of each microcircuit of the wafer. In addition, the cost of manufacturing a rigid probe device is relatively less than the cost of manufacturing a vertical probe card, for example. This is because the rigid probes, unlike the vertical probes, may be fabricated using photolithography. While rigid probes facilitate conveying more power than flexible vertical probes, the lack of deformation in any aspect of the probe device can create issues in coupling to non-uniform solder balls. The shape of solder balls is generally characterized by height, diameter, and volume (e.g., of tin). The tin height of solder balls is generally decreasing (e.g., from 55 micrometers (microns) to 17 microns), and contact points on the order of 20,000 to 30,000 solder balls may be present on a given microcircuit. Thus, any increased tolerance due to the shape of the solder balls can make achieving electrical contact with the complete set of solder balls of the microcircuit challenging.

SUMMARY

Embodiments of the present invention are directed to wafer test devices. A wafer test device includes a first laminate structure, and a second laminate structure arranged to interface with a microcircuit of the wafer. A compliant layer between the first laminate structure and the second laminate structure includes an elastomer that exhibits compliance within a limited range of movement.

Embodiments of the present invention are also directed to methods of assembling a wafer test device. A method includes forming a first laminate structure, and arranging a second laminate structure arranged to interface with a microcircuit of the wafer. A compliant layer is arranged between the first laminate structure and the second laminate structure. The compliant layer includes an elastomer that exhibits compliance within a limited range of movement.

BRIEF DESCRIPTION OF THE DRAWINGS

The examples described throughout the present document will be better understood with reference to the following drawings and description. The components in the figures are not necessarily to scale. Moreover, in the figures, like-referenced numerals designate corresponding parts throughout the different views.

FIGS. 3A, 3B, and 3C illustrate the need for a compliant organic substrate assembly for rigid probes according to one or more embodiments, in which:

FIG. 3A shows a solder bump with a height of 55 microns;
FIG. 3B shows a solder bump with a height of 40 microns;
FIG. 3C shows a solder bump with a height of 17 microns;

DETAILED DESCRIPTION

Figure 1:
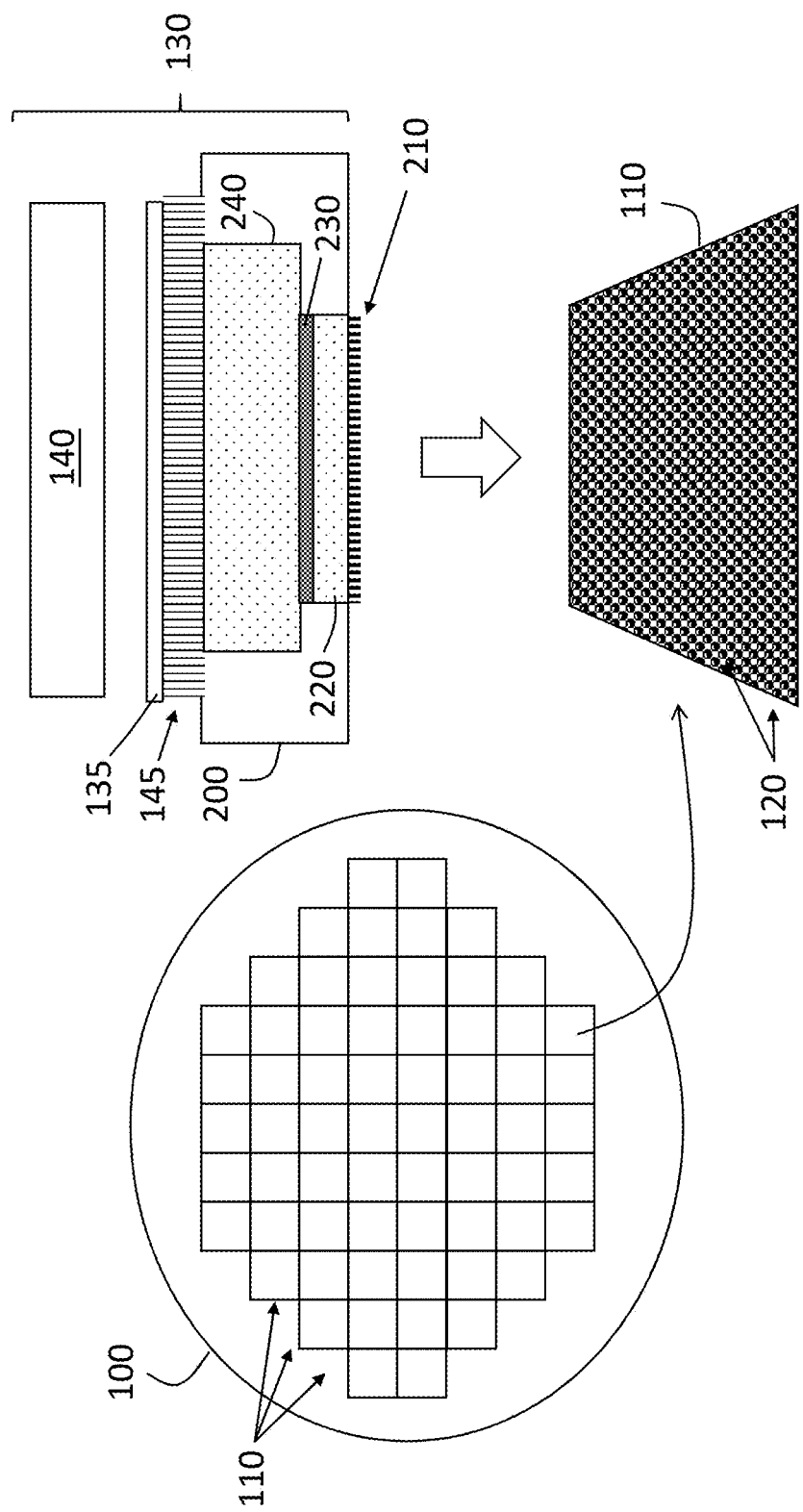
FIG. 1 depicts a wafer and corresponding wafer prober according to one or more embodiments of the invention.

As previously noted, the rigid probes of a rigid probe device can convey more power to the contact points of microelectronic devices of a wafer under test as compared with flexible probe needles of a vertical probe device. Typically, a rigid probe device includes two laminate structures with a layer of copper balls soldered therebetween to increase the rigidity of the laminate support structure. The rigid probes are formed by photolithography on the laminate support structure and, more specifically, on the surface of one of the laminate structures, opposite the surface that is soldered to the copper balls. As also previously noted, properly contacting every contact point of each microcircuit of a wafer under test can be challenging with the right probe device. Lower heights of solder balls, generally, and non-uniform heights of solder balls across the microelectronic devices of a microcircuit can result in inadequate contact between a number of rigid probes and corresponding solder balls. Adequate contact requires approximately 10-15 microns of deformation of the solder ball. The solder balls of a given microcircuit may generally have a concave shape because solder balls on the periphery of each microcircuit are relatively higher (e.g., 8 microns higher) than those closer to the center of the microcircuit. Yet, the rigid laminate structure that supports the rigid probes results in all of the rigid probes being at the same uniform level above the microcircuit. Thus, while this level may be sufficient to contact and deform many of the solder balls (e.g., those on the periphery of the microcircuit), it may not be sufficient to contact all of the solder balls (e.g., those closer to the center of the microcircuit). A failure to establish proper contact between a rigid probe and its corresponding solder ball can result in inadequate wafer testing and inaccurate results.

Embodiments of the invention relate to a compliant organic substrate assembly for rigid probes. While the power and performance capabilities of rigid probes are retained, the support structure is made to be more compliant in a specific way. The laminate structure on which the rigid probes are formed can deflect relative to the other laminate structure. This independent deflection of the two laminate structures results from replacing the soldered copper balls between the two laminate structures with a compliant layer, as detailed. That is, the ability of the compliant layer between the laminate structures to be deformed or compressed can result in the different degrees of deflection of the two laminate structures. The laminate structure on which the rigid probes are formed can be made to deflect in order to match the contour (e.g., concave shape) of the solder bump array of the chip while the other laminate structure of the support structure can remain unchanged or deformed to a different degree. The load applied to the probe device to achieve the increased contact between the rigid probes and solder bumps is unchanged from the load required by the fully rigid probe device.

FIG. 1 depicts a wafer 100 and corresponding wafer test components 130 according to one or more embodiments of the invention. A wafer 100 can include a number of microcircuits 110 that are tested in turn. A microcircuit 110 may be on the order of 1 square-inch, for example, and is shown to include a number of solder bumps 120 that function as contact points to test the microcircuit 110. The wafer 100 may be supported and moved into place for testing by a wafer prober (not shown). The wafer test components 130 includes a test interconnect 200 that acts as an electrical and mechanical interface between the microcircuit 110 under test and the test apparatus 140 that controls the testing. That is, the test apparatus 140 determines and controls the test patterns that are applied to the microcircuit 110 under test through the test interconnect 200. The test interconnect 200 includes a thin flexible laminate structure 220 and a thicker stiff laminate structure 240 that are connected by a compliant layer 230. Rigid probes 210 extend from the laminate structure 220 to couple to the solder bumps 120 of the microcircuit 110 under test. Floating pins 145 (e.g., pogo pins or spring-loaded pins) extend from the laminate structure 240 and couple to a printed circuit board (PCB) 135, as shown. The test apparatus 140 couples to the PCB 135.

In prior wafer prober test interconnects (i.e., rigid probe devices) that are completely rigid, the laminate structures can be connected by a layer of copper balls soldered to the laminate structures on opposite sides with epoxy fill to further stiffen the test interconnect. As discussed with reference to FIG. 2, the compliant layer 230, according to one or more embodiments of the invention, facilitates independent flexion capability for each of the laminate structures 220, 240. The compliant layer 230 is designed or tuned for a particular wafer 100. As such, the compliance required for the compliant layer 230 to facilitate deformation of solder bumps 120 with a given tolerance is achieved.

The test apparatus 140 refers to the processor, memory, and other components that control the test patterns that are implemented on each microcircuit 110 under test. For example, the test apparatus 140 can include an automatic test pattern generator (ATPG) that applies a sequence of signals to the microcircuit 110 under test via the test interconnect 200. The test apparatus 140 distinguishes between correct circuit behavior induced by the sequence of signals and faulty circuit behavior that indicates defects in the microcircuit 110 under test. As previously noted, the test apparatus 140 can connect to a PCB 135 that couples to the test interconnect 200. The test apparatus 140 can control the signals that are provided to the microcircuit 110 under test through the test interconnect 200 and, more specifically, each rigid probe 210.

The laminate structure 220 matches in size approximately to each microcircuit 110 of the wafer 100. The laminate structure 240 can have a larger area than a microcircuit 110 and facilitate a change in scale such that the PCB 135 that is larger than a microcircuit 110 can be coupled to the microcircuit 110 through the test interconnect 200. The floating pins 145 that extend from a surface of the laminate structure 240 of the test interconnect 200 facilitate coupling between the test interconnect 200 and the PCB 135. The rigid probes 210 that extend from the laminate structure 220 of the test interconnect 200 facilitate coupling between the test interconnect 200 and the microcircuit 110 under test. Each solder bump 120 of the microcircuit 110 is contacted and deformed by a rigid probe 210.

Generally, in order to perform wafer testing, the wafer 100 is moved to establish contact between the solder bumps 120 of a microcircuit 110 and the rigid probes 210 of the test interconnect 200. In order to perform testing accurately, electrical contact must be established between each solder bump 120 of the microcircuit 110 and each corresponding rigid probe 210 of the test interconnect 200. Specifically, each rigid probe 210 must contact and deform the corresponding solder bump 120. As the pitch (i.e., distance between the centers of adjacent solder bumps 120) and size of the solder bumps 120 are decreasing in the technology, establishing sufficient electrical contact is more challenging. According to one or more embodiments of the invention, the compliant layer 230 is fabricated such that the rigid probes 210 or areas of rigid probes 210, which are supported by the compliant layer 230, can move independently of each other rather than as a single rigid layer. Thus, during the process when the wafer 100 is brought into contact with the wafer testing elements 130, the wafer 100 can be moved toward the wafer testing elements 130 until the smallest or farthest away solder bumps 120 make contact with their corresponding rigid probe 210. The compliance in the compliant layer 230 allows rigid probes 210 that have already contacted larger or closer solder bumps 120 to deflect (i.e., move back) with the laminate structure 220 based on compression of the compliant layer 230 in the area of those rigid probes 210.

Figure 2:
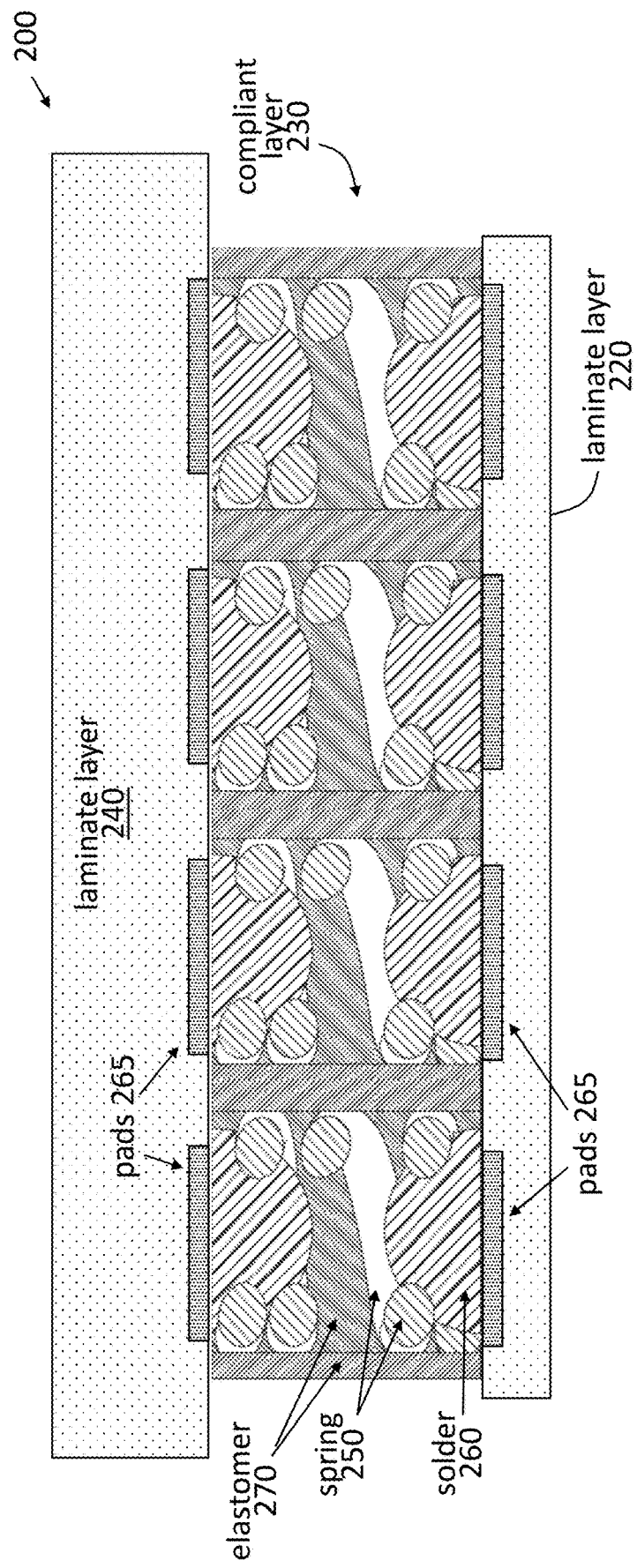
FIG. 2 is a cross-sectional view of aspects of the test interconnect according to one or more embodiments of the invention.

FIG. 2 is a cross-sectional view of aspects of the test interconnect 200 according to one or more embodiments of the invention. FIG. 2 details an exemplary compliant layer 230 of the test interconnect 200. A spring 250 is joined to the laminate structures 220, 240 on opposite sides with solder 260. The spring 250 can be comprised of copper according to an exemplary embodiment of the invention. Pads 265 (e.g., gold-plated pads) on the laminate structures 220, 240 facilitate conductivity and solder-ability. An elastomer 270 is used as a fill between and among the springs 250. Thus, instead of the inflexible copper balls and epoxy fill used in prior rigid wafer probe technology, the exemplary embodiment of the compliant layer 230 includes springs 250 and elastomer 270 as fill. The elastomer 270 has more elasticity than epoxy but does not become permanently deformed. As a result, the elastomer 270 facilitates a degree of compliance beyond which it exhibits rigidity, and the degree of compliance can be tuned. That is, the elastomer 270 is compliant within a limited range of movement, which can be tuned, and is rigid beyond that range. Put another way, the load required for compliance (i.e., compression) of the elastomer 270 increases exponentially beyond a certain range of movement, and the material of the elastomer can be selected to tune that range beyond which the exponential increase in load occurs.

Figure 3:
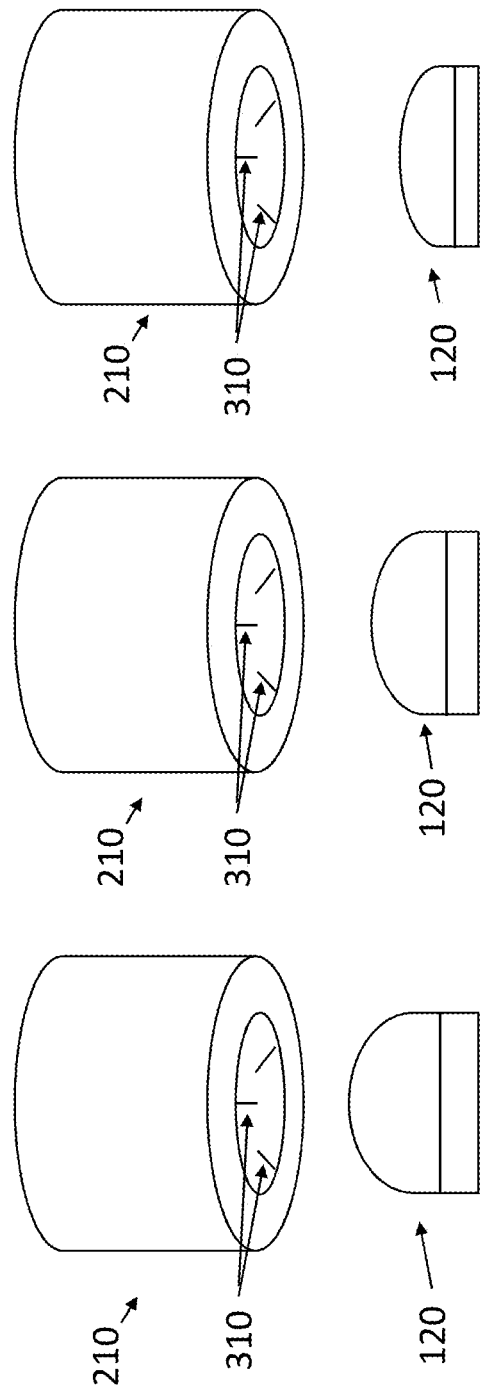

As previously noted, the compliant layer 230 is designed or tuned for a particular wafer 100. The shape and tolerance of the solder bumps 120 of each microcircuit 110 (e.g., concave shape) are two of the parameters associated with a wafer 100 that affect the required compliance. This is further discussed with reference to FIGS. 3 and 4. The required compliance refers to the flexibility needed in the test interconnect 200 to ensure that all of the solder bumps 120 of each microcircuit 110 of the wafer 100 will be deformed by corresponding rigid probes 210 sufficiently to establish electrical contact. Exemplary parameters that are tuned in the compliant layer 230 include dimensions of the spring 250 and thickness and hardness of the elastomer 270. For example, the spring 250 can be a copper spring with a diameter on the order of 0.1 millimeters (mm). An exemplary elastomer 270 can have a thickness of 0.508 mm and a hardness of 90 in the Shore A scale.

FIGS. 3A, 3B, and 3C illustrate one of the factors that give rise to the need for a compliant organic substrate assembly for rigid probes 210 according to one or more embodiments. Each of the figures shows a solder bump 120 and a corresponding rigid probe 210. As shown, each rigid probe 210 includes three blades 310. When the microcircuit 110 is moved into contact with the wafer testing elements 130, the blades 310 of each rigid probe 210 contact and deform the corresponding solder bump 120 in order to establish electrical contact. The solder bumps 120 shown in FIGS. 3A, 3B, and 3C exhibit different shapes(i.e., height/diameter) and can be arranged with different pitches. FIG. 3A shows an exemplary solder bump 120 with a pitch of 150 microns. The height of the solder bump 120 is 55 microns. FIG. 3B shows an exemplary solder bump 120 with a height of 40 microns. FIG. 3C shows an exemplary solder bump 120 with a pitch of 50 microns. The height of the solder bump 120 is 17 microns.

Electrical contact is more difficult to establish with the exemplary solder bump 120 shown in FIG. 3C than with the exemplary solder bump 120 shown in FIG. 3A. For example, the blades 310 of the rigid probe 210 shown in FIG. 3A can deform the solder bump 120 up to 20 microns to ensure sufficient contact. However, the solder bump 120 shown in FIG. 3C is only 17 microns high to start with. Thus, the margin for establishing contact with solder bumps 120 with heights on the order of the height shown in FIG. 3C is much narrower. That is, small variations in solder bumps 120 with heights in the 17 micron range can result in gaps between some shorter solder bumps 120 and their corresponding rigid probes 210 if all the rigid probes 210 are maintained at the same level. There can be on the order of 8 microns of variation in the height of solder bumps 120 of a microcircuit 110, for example. Thus, the compliant layer 230 according to one or more embodiments of the invention, which facilitates independent deflection in regions of the compliant layer 230 based on different degrees of compression and, thus, independent deflection among corresponding rigid probes 210, increases the possibility of establishing contact despite this narrower margin.

Figure 4:
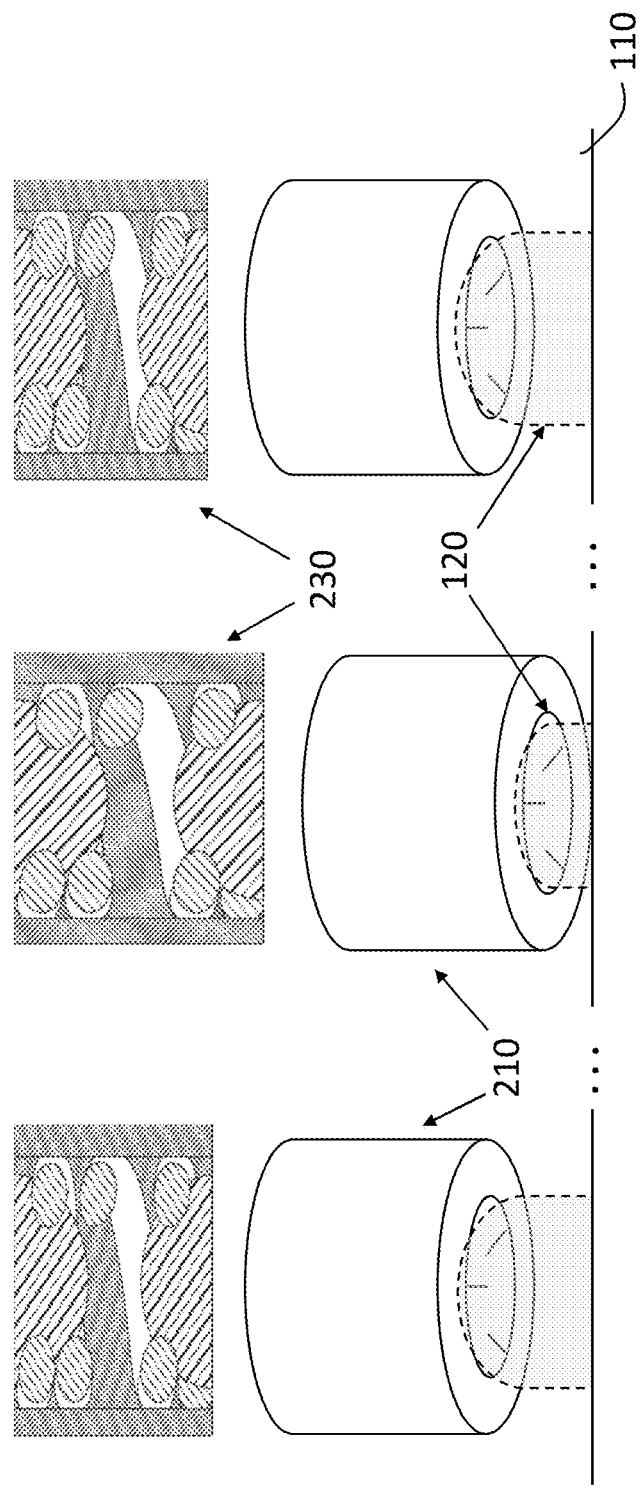
FIG. 4 illustrates a concave solder bump array profile requiring a compliant organic substrate assembly for rigid probes according to one or more embodiments.

FIG. 4 illustrates another factor that gives rise to the need for a compliant organic substrate assembly for rigid probes 210 according to one or more embodiments. Three exemplary solder bumps 120 of a microcircuit 110 are shown for explanatory purposes. As indicated by the discontinuities, the solder bumps 120 shown in FIG. 4 are not necessarily adjacent. The two solder bumps 120 on the ends represent solder bumps 120 at the perimeter of the microcircuit 110 and the solder bump 120 in the middle represents a solder bump 120 in a central region of the microcircuit 110. As FIG. 4 indicates, the solder bumps 120 of a microcircuit 110 generally have a concave shape. This is because the electroplating process that forms the solder bumps 120 typically results in greater height of the solder bumps 120 near the perimeter of the microcircuit 110. The result is a concave shape among the solder bumps 120 of a given microcircuit 110. The exemplary solder bumps 120 are all shown in contact with the corresponding rigid probes 210.

In FIG. 4, the cross-sectional view of an exemplary compliant layer 230 of the test interconnect 200 is shown without the laminate structures 220, 240, which are rigid (i.e., cannot be compressed). As previously noted, based on compression of one or more areas of the compliant layer 230 between the laminate structures 220, 240, the laminate structures 220, 240 can deflect differently in those different areas. However, without the compression facilitated by the compliant layer 230 according to one or more embodiments of the invention, deflection alone cannot achieve the coupling between the rigid probes 210 and solder bumps 120 facilitated according to one or more embodiments of the invention. The distance between each rigid probe 210 and the compliant layer 230 above is the same to indicate that this space would be filled with the laminate structure 220, whose thickness would not change (i.e., no compression of the laminate structure 220) regardless of any compression in the compliant layer 230 itself. In addition, the laminate structure 240 is not compressed but can also deflect. In FIG. 4, the compliance of the portion of the compliant layer 230 that corresponds with each rigid probe 210 is of interest and is, therefore, shown in isolation. Specifically, the compression of the portion of the compliant layer 230 that corresponds with each rigid probe 210 is shown following establishment of contact between the rigid probes 210 and solder bumps 120. As FIG. 4 illustrates, the compliant layer 230 is more deformed (i.e., compressed) above the rigid probes 210 at the perimeter than above the rigid probe 210 at the center. This non-uniform deformation of the compliant layer 230 facilitates the contact between all the rigid probes 210 and their corresponding solder bumps 120, despite the concave shape of the solder bumps 120 on the surface of the microcircuit 110.

Figure 5:
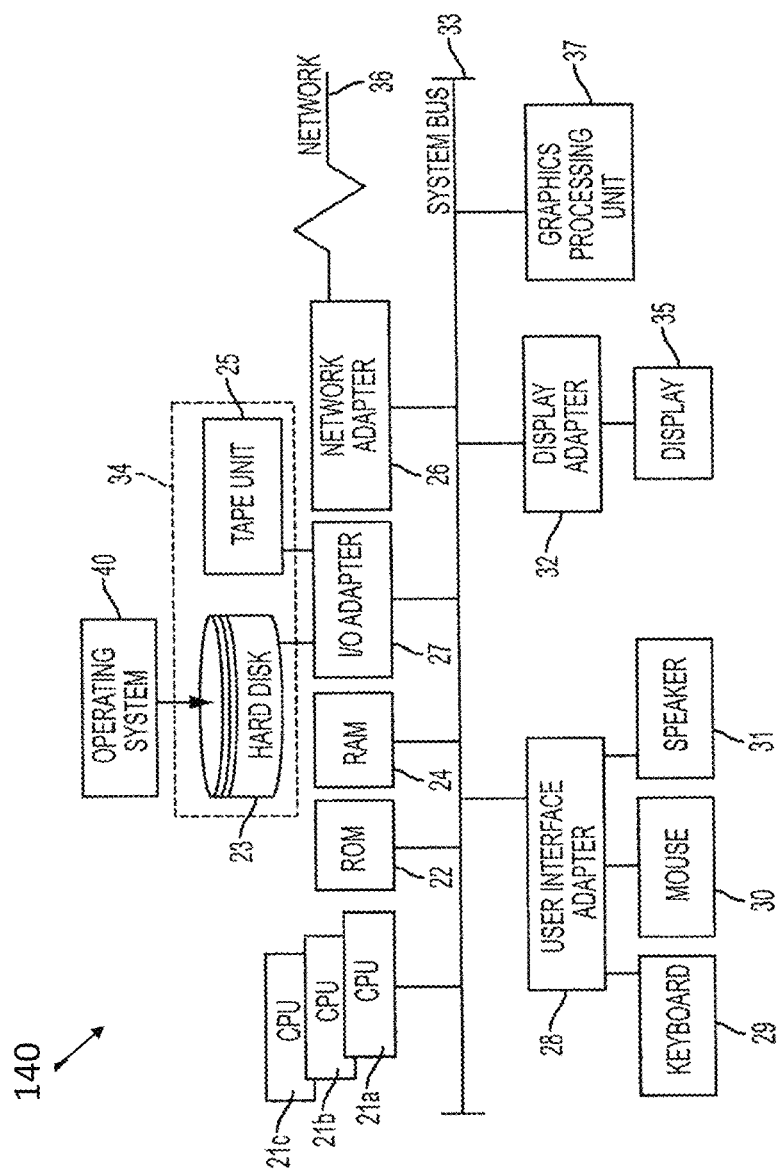
FIG. 5 is a block diagram of aspects of the test apparatus used with a compliant organic substrate assembly for rigid probes according to one or more embodiments.

FIG. 5 is a block diagram of aspects of the test apparatus 140. As previously noted, the test apparatus 140 generates the test patterns used to test the microcircuit 110 to which the test apparatus 140 is coupled through the test interconnect 200. The test apparatus 140 includes one or more central processing units (processors) $21a$, $21b$, $21c$, etc. (collectively or generically referred to as processor(s) 21 and/or as processing device(s)). According to one or more embodiments of the present invention, each processor 21 can include a reduced instruction set computer (RISC) microprocessor. Processors 21 are coupled to system memory (e.g., random access memory (RAM) 24) and various other components via a system bus 33. Read only memory (ROM) 22 is coupled to system bus 33 and can include a basic input/output system (BIOS), which controls certain basic functions of the test apparatus 140.

Further illustrated are an input/output (I/O) adapter 27 and a communications adapter 26 coupled to system bus 33. I/O adapter 27 can be a small computer system interface (SCSI) adapter that communicates with a hard disk 23 and/or a tape storage drive 25 or any other similar component. I/O adapter 27, hard disk 23, and tape storage device 25 are collectively referred to herein as mass storage 34. Operating system 40 for execution on processing system 110 can be stored in mass storage 34. The RAM 22, ROM 24, and mass storage 34 are examples of memory 19 of the processing system 110. A network adapter 26 interconnects system bus 33 with an outside network 36 enabling the test apparatus 140 to communicate with other such systems.

A display (e.g., a display monitor) 35 is connected to system bus 33 by display adaptor 32, which can include a graphics adapter to improve the performance of graphics intensive applications and a video controller. According to one or more embodiments of the present invention, adapters 26, 27, and/or 32 can be connected to one or more I/O busses that are connected to system bus 33 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 33 via user interface adapter 28 and display adapter 32. A keyboard 29, mouse 30, and speaker 31 can be interconnected to system bus 33 via user interface adapter 28, which can include, for example, a Super I/O chip integrating multiple device adapters into a single integrated circuit.

According to one or more embodiments of the present invention, the test apparatus 140 includes a graphics processing unit 37. Graphics processing unit 37 is a specialized electronic circuit designed to manipulate and alter memory to accelerate the creation of images in a frame buffer intended for output to a display. In general, graphics processing unit 37 is very efficient at manipulating computer graphics and image processing and has a highly parallel structure that makes it more effective than general-purpose CPUs for algorithms where processing of large blocks of data is done in parallel.

Thus, as configured herein, the test apparatus 140 includes processing capability in the form of processors 21, storage capability including system memory (e.g., RAM 24), and mass storage 34, input means such as keyboard 29 and mouse 30, and output capability including speaker 31 and display 35. According to one or more embodiments of the present invention, a portion of system memory (e.g., RAM 24) and mass storage 34 collectively store an operating system such as the AIX® operating system from IBM Corporation to coordinate the functions of the various components shown in the test apparatus 140.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A wafer test device, comprising:
    a first laminate structure including a first pad;
    a second laminate structure arranged to interface with a microcircuit of the wafer, the second laminate structure including a second pad; and
    a compliant layer between the first laminate structure and the second laminate structure, the compliant layer including an elastomer that exhibits compliance within a limited range of movement and a coil spring fixed to the first laminate structure and the second laminate structure, wherein the coil spring is soldered to the first pad of the first laminate structure on a first side of the coil spring and is soldered to the second pad of the second laminate structure on a second side, opposite the first side, of the coil spring;
    wherein the compliant layer compresses to provide independent deflection of the second laminate structure with respect to the first laminate structure.

2. The device according to claim 1, wherein the first pad of the first laminate structure and the second pad of the second laminate structure are gold-plated pads such that the spring is soldered to the gold-plated pad of the first laminate structure on the first side and is soldered to the gold-plated pad of the second laminate structure on the second side.

3. The device according to claim 1, further comprising a test apparatus coupled to the first laminate structure, the test apparatus being configured to generate test patterns that are applied to the microcircuit.

4. The device according to claim 3, further comprising floating pins configured to couple the test apparatus to the first laminate structure.

5. The device according to claim 1, further comprising rigid probes configured to couple the microcircuit to the second laminate structure.

6. The device according to claim 5, wherein the rigid probes are spaced such that each rigid probe couples with a solder bump of the microcircuit.

7. The device according to claim 1, wherein the elastomer of the compliant layer exhibits compliance in a particular range of movement and exhibits rigidity beyond the range of movement.

8. The device according to claim 7, wherein a material of the elastomer determines the particular range of movement.

9. A method of assembling a wafer test device, the method comprising:
    forming a first laminate structure including a first pad;
    arranging a second laminate structure arranged to interface with a microcircuit of the wafer, the second laminate structure including a second pad;
    arranging a compliant layer between the first laminate structure and the second laminate structure, the compliant layer including an elastomer that exhibits compliance within a limited range of movement and a coil spring; and
    soldering the spring to the first pad of the first laminate structure on a first side of the spring and to the second pad of the second laminate structure on a second side, opposite the first side, of the spring to fix the coil spring to the first laminate structure and the second laminate structure;
    compressing the compliant layer to provide independent deflection of the second laminate structure with respect to the first laminate structure.

10. The method according to claim 9, wherein the first pad and the second pad are gold-plated pads, and the soldering includes soldering the spring to the gold-plated pad of the first laminate structure on the first side and to the gold-plated pad of the second laminate structure on the second side.

11. The method according to claim 9, further comprising coupling the first laminate structure to a test apparatus, the test apparatus being configured to generate test patterns that are applied to the microcircuit.

12. The method according to claim 11, wherein the coupling the first laminate structure to the test apparatus is with floating pins.

13. The method according to claim 9, further comprising attaching rigid probes to the second laminate structure to couple the microcircuit to the second laminate structure.

14. The method according to claim 13, wherein the rigid probes are spaced such that each rigid probe couples with a solder bump of the microcircuit.

15. The method according to claim 9, further comprising designing the elastomer of the compliant layer to exhibit compliance in a particular range of movement and to exhibit rigidity beyond the range of movement.

16. The method according to claim 15, wherein the designing the elastomer includes selecting a material of the elastomer to control the particular range of movement.

* * * * *